(12) United States Patent
Willmeroth et al.

(10) Patent No.: US 8,405,146 B2
(45) Date of Patent: Mar. 26, 2013

(54) COMPONENT ARRANGEMENT INCLUDING A MOS TRANSISTOR HAVING A FIELD ELECTRODE

(75) Inventors: Armin Willmeroth, Augsburg (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/773,580

(22) Filed: May 4, 2010

(65) Prior Publication Data
US 2010/0213506 A1    Aug. 26, 2010

Related U.S. Application Data

(62) Division of application No. 12/021,709, filed on Jan. 9, 2008, now abandoned.

(30) Foreign Application Priority Data

Jan. 29, 2007   (DE) .......................... 10 2007 004 323

(51) Int. Cl.
    *H01L 29/76*  (2006.01)
(52) U.S. Cl. ................... 257/340; 257/E29.007
(58) Field of Classification Search .............. 257/340, 257/577, E29.007
    See application file for complete search history.

(56) References Cited

U.S. PATENT DOCUMENTS

| | | | |
|---|---|---|---|
| 4,903,189 A | 2/1990 | Ngo et al. | |
| 4,941,026 A | 7/1990 | Temple | |
| 6,348,716 B1 | 2/2002 | Yun | |
| 6,555,873 B2 | 4/2003 | Disney et al. | |
| 6,717,230 B2 | 4/2004 | Kocon | |
| 6,853,033 B2 | 2/2005 | Liang et al. | |
| 2002/0190282 A1 | 12/2002 | Calafut | |
| 2003/0178676 A1 | 9/2003 | Henninger et al. | |
| 2006/0006386 A1 | 1/2006 | Hirler et al. | |
| 2007/0023830 A1* | 2/2007 | Pfirsch et al. | 257/341 |
| 2007/0126056 A1* | 6/2007 | Hirler | 257/330 |

FOREIGN PATENT DOCUMENTS
EP   1589585 A1   10/2005

* cited by examiner

*Primary Examiner* — Wael Fahmy
*Assistant Examiner* — Sarah Salerno
(74) *Attorney, Agent, or Firm* — Dicke, Billig & Czaja, PLLC

(57) ABSTRACT

A component arrangement including a MOS transistor having a field electrode is disclosed. One embodiment includes a gate electrode, a drift zone and a field electrode, arranged adjacent to the drift zone and dielectrically insulated from the drift zone by a dielectric layer a charging circuit, having a rectifier element connected between the gate electrode and the field electrode.

12 Claims, 10 Drawing Sheets

COMPONENT ARRANGEMENT INCLUDING A MOS TRANSISTOR HAVING A FIELD ELECTRODE

CROSS-REFERENCE TO RELATED APPLICATIONS

This Divisional Patent Application claims priority to U.S. patent application Ser. No. 12/021,709, filed on Jan. 29, 2008, which claims priority to German Patent Application No. DE 10 2007 004 323.8-33, filed on Jan. 29, 2007, which is incorporated herein by reference.

BACKGROUND

In a component arrangement including a MOS transistor having a drift zone and a field electrode arranged adjacent to the drift zone the field electrode can be connected to a source zone of the MOS transistor. In this case, with the component in the off state, the field electrode provides a countercharge with respect to the charge which is present in the drift zone and which results from a doping of the drift zone. Charge carriers in the drift zone are compensated for by the countercharge, whereby a higher doping of the drift zone and thus a lower on resistance are possible for a given dielectric strength.

The field electrode can also be connected to a gate electrode of the MOS transistor. In this case, with the component in the on state, the field electrode brings about the formation of an accumulation channel in the drift zone. This reduces the on resistance for a given dielectric strength.

However, the connection of the field electrode to the gate electrode increases the gate-drain capacitance of the component and leads to an increase in the switching delay since with each switch-on operation, apart from the gate electrode the field electrode also has to be charged from the gate circuit or by using a gate driver circuit. For a given current yield of the gate driver circuit, when a field electrode is present, the time duration required to charge the gate electrode up to the threshold voltage and thereby to drive the component in the on state is lengthened in comparison with a component without a field electrode.

For these and other reasons, there is a need for the present invention.

SUMMARY

One embodiment provides a component arrangement including a MOS transistor having a gate electrode, a drift zone and a field electrode, which is arranged adjacent to the drift zone and is dielectrically insulated from the drift zone by a dielectric layer, and a charging circuit, which is connected between the gate electrode and the field electrode and which has a rectifier element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a component arrangement including a MOS transistor having a gate electrode, a drift zone and a field electrode, which is arranged adjacent to the drift zone and is dielectrically insulated from the drift zone by a dielectric layer, and a charging circuit, which is connected between the gate electrode and the field electrode and which has a rectifier element.

Figure 1:
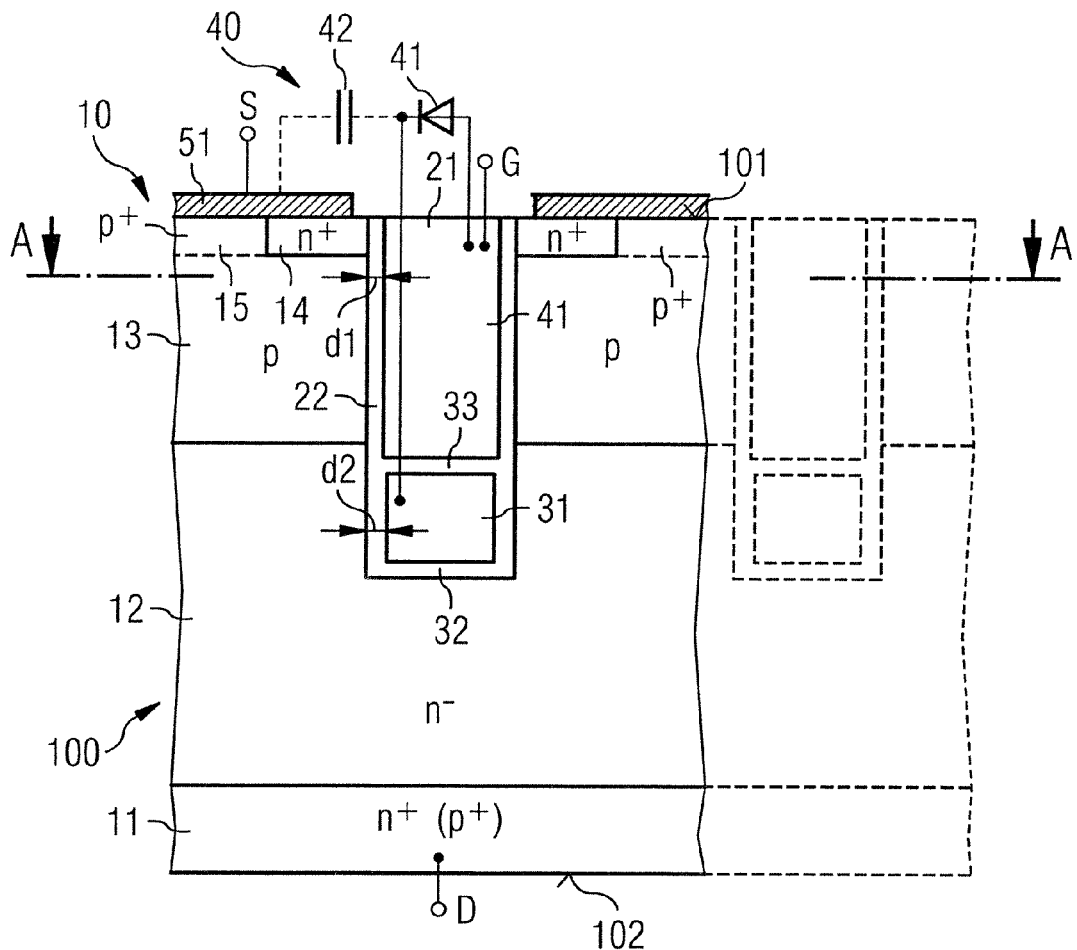
FIG. 1 illustrates one embodiment of a component arrangement with a MOS transistor having a gate electrode and a field electrode, and with a charging circuit connected between the gate electrode and the field electrode and having a rectifier element.

FIG. 1 illustrates one embodiment of a component arrangement, having a MOS transistor 10 having a field electrode 31 arranged adjacent to a drift zone 12, and a charging circuit 40 for the field electrode 31. FIG. 1 schematically illustrates the MOS transistor 10 on the basis of a cross section through a semiconductor body 100 in which the MOS transistor 10 is integrated. Hereinafter, "integration of the MOS transistor in the semiconductor body" should not be understood restrictively such that all the components of the MOS transistor are present within the semiconductor body 100, rather it should also be understood in particular such that component elements, in particular connection electrodes, of the MOS transistor can be arranged on a first or second side of the semiconductor body 100.

In one embodiment, the MOS transistor 10 is realized as a vertical transistor and has a drift zone 12 arranged in a vertical direction of the semiconductor body 100 between a drain zone 11 and a body zone 13. The body zone 13 is arranged between the drift zone 12 and a source zone 14 and is doped complementarily to the drift zone 12 and the source zone 14. A gate electrode 21 is arranged adjacent to the body zone 13, the gate electrode being dielectrically insulated from the body zone 13 by a first dielectric layer 22, which is referred to hereinafter as gate dielectric layer. The gate electrode 21 extends adjacent to the body zone 13 from the source zone 14 as far as the drift zone 12 and serves for controlling an inversion channel in the body zone 13 between the source zone 14 and the drift zone 12.

The source zone 14 is arranged in the region of a first side 101, which is referred to hereinafter as front side, of the semiconductor body 100 and contact is made with the source zone by a source electrode 51. The source electrode 51, in a manner known in principle, also makes contact with the body zone 13 in order thereby to short-circuit the body zone 13 and the source zone 14. In this case, a connection zone 15 of the same conduction type as the body zone 13 and doped more highly than the body zone 13 is optionally present, the connection zone being arranged between the connection electrode 51 and the body zone 13.

In one embodiment, the field electrode 31 is arranged in the drift zone 12 and is dielectrically insulated from the drift zone 12 by a second dielectric layer 32, which is referred to hereinafter as field electrode dielectric layer. The field electrode dielectric layer 32 can be composed of the same material as the gate dielectric layer 22, but the two dielectric layers 22, 32 can also be composed of different dielectric materials and can have in particular different thicknesses d1, d2.

The MOS transistor illustrated has a trench structure. In this case, the gate electrode 21 is arranged in a trench which extends, proceeding from the front side 101, in the vertical direction into the semiconductor body 100. In this case, the gate electrode 21 is arranged adjacent to the source zone 14 and the body zone 13 in a lateral direction of the semiconductor body 100. An inversion channel that forms when the MOS transistor is driven in the on state runs in the body zone 13 in the vertical direction of the semiconductor body 100 along the gate dielectric 22 between the source zone 14 and the drift zone 12.

In the case of the component illustrated in FIG. 1, the field electric 31 is arranged in the same trench as the gate electrode 21 and, proceeding from the front side 101, in the vertical direction below the gate electrode 21. In a manner not illustrated in greater detail, however, there is also the possibility of arranging the field electrode 31 in the vertical direction below the gate electrode 21, but offset with respect to the gate electrode 21 in a lateral direction.

The MOS transistor illustrated in FIG. 1 can be constructed in cellular fashion, that is to say can have a multiplicity of structures of identical type each having a source zone, a body zone, a gate electrode and a field electrode, which are connected in parallel. This is indicated by dashed lines in FIG. 1. In this case, the drain zone 11 and the drift zone 12 can be shared by the individual transistor cells connected in parallel.

The component arrangement furthermore includes a charging circuit 40 with a rectifier element 41, for example a diode, which is connected between the gate electrode 21 and the field electrode 31. The charging circuit can optionally have a capacitive storage element 42 connected between the field electrode 31 and the source zone 14 or the source electrode 51.

The MOS transistor illustrated in FIG. 1 is realized as an n-channel MOSFET. The drift zone 12, the source zone 14 and the drain zone 11 are n-doped in this case, the drift zone 12 being doped more lightly than the drain zone 11. The body zone 13 is p-doped in the case of the n-channel MOSFET. It should be pointed out that the invention is not restricted to the use of an n-channel MOSFET, however. The invention can also be applied to an IGBT, in particular. Such an IGBT differs from an n-channel MOSFET by virtue of the fact that its drain zone, which is also referred to as emitter zone in the case of an IGBT, is doped complementarily to the drift zone, which is represented between parentheses in FIG. 1. Furthermore, the invention can also be applied to p-channel MOSFETs, in which the component zones are doped complementarily to the dopings specified in FIG. 1. The polarity of the rectifier element 41 of the charging circuit should be interchanged in this case.

Figure 2:
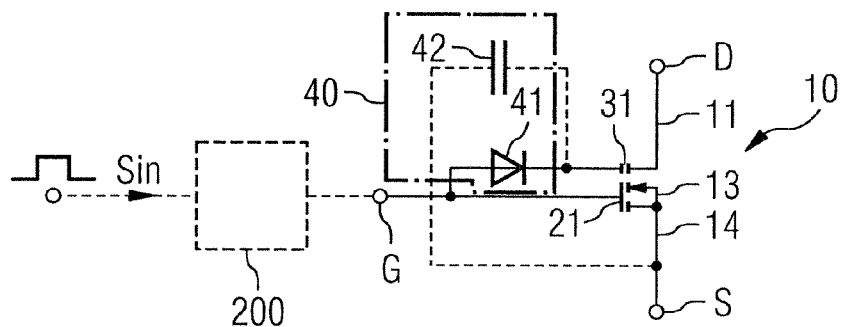
FIG. 2 illustrates the electrical equivalent circuit diagram of one embodiment of the component arrangement.

FIG. 2 illustrates the electrical equivalent circuit diagram of the component arrangement illustrated in FIG. 1. In this equivalent circuit diagram, the MOS transistor 10 is represented as the circuit symbol of an n-channel MOSFET having two control electrodes, one of which represents the gate electrode 21 and the other of which represents the field electrode 31.

One embodiment of the functioning of the component arrangement is explained below with reference to FIGS. 1 and 2. For explanation purposes, it is assumed that a driver circuit 200 is connected to the gate electrode or the gate connection G of the MOS transistor 10 during operation, the driver circuit being designed to drive the MOS transistor 10 in the on state or in the off state according to a driving signal Sin. The n-channel MOSFET illustrated is driven in the on state by charging the gate electrode 21 to a driving potential which lies above the electrical potential of the source zone 14 or the source connection S by the value of a threshold voltage of the MOSFET. The MOSFET is turned off if the gate electrode is or has been discharged to an electrical potential lying below the driving potential.

It shall be assumed for the further explanation that the gate electrode 21 and the field electrode 31 are initially fully discharged. In a first driving operation, by which the MOS transistor 10 is driven in the on state, the gate electrode 21 is charged to the driving potential by the driver circuit 200. In addition, the field electrode 31 is charged, by the charging circuit 40, to an electrical potential corresponding to the driving potential minus the forward voltage of the rectifier element 41. Assuming that the driving potential relative to the source potential is large in comparison with the forward voltage of the rectifier element 41, the field electrode 31 is charged approximately to the driving potential by the charging circuit 40. Depending on the capacitance of the field electrode 31 and depending on the duration for which the MOS transistor remains switched on after first being switched on, it can take one or more driving cycles of the MOS transistor for the field electrode 31 to be charged to driving potential.

A resistor (not illustrated) can optionally be connected in series with the diode 41, the resistor preventing a situation in which, during the first driving cycle or during the first driving cycles, the current portion flowing from the gate circuit into the field electrode 31 is so large that not enough charge flows onto the gate electrode and the component fails to be driven in the on state. Such a resistor only "brakes" the charging of the field electrode 31, such that fundamental switching on of the component is not prevented, although the full effect of the field electrode for reducing the on resistance commences only after a delay.

If the gate electrode 21 has been charged up to the driving potential, then an inversion channel forms between the source zone and the drift zone in the body zone 13 along the gate dielectric 22, and enables a current to flow between the drain connection D and the source connection S when supply voltage is present across the drain-source path of the MOS transistor. In this case, the field electrode 31 charged to the driving potential has the effect that an accumulation channel forms in the drift zone 12 along the field electrode dielectric 32. The electrical resistance in the accumulation channel is lower than in other regions of the drift zone 12, such that the on resistance of the MOS transistor 10 illustrated is lower than that of a comparable MOS transistor without a field electrode. In this case, the formation of the accumulation channel along the field electrode dielectric 32 is all the more pronounced, the better the capacitive coupling between the field electrode 31 and the drift zone 12. The capacitive coupling can be increased for example by using a high-dielectric (high-k) material for the field plate dielectric 32. Furthermore, the capacitive coupling improves as the thickness d2 of the field plate dielectric 32 becomes smaller. However, the thickness of the field plate dielectric 32 should be chosen to be large enough that the latter has a sufficient dielectric strength in relation to the voltage present when the component is driven in the off state, as is explained below. When the MOS transistor is driven in the off state, the gate electrode 21 is discharged by the driver circuit, for example to the value of the source potential, whereby an inversion channel previously present is interrupted and the component turns off. When voltage is present across the load path D-S, in this case a space charge zone propagates proceeding from the pn junction between the body zone 13 and the drift zone 12 essentially into the drift zone 12. In the case of an n-channel MOSFET and a positive drain-source voltage, the electrical potential rises in this case proceeding from the pn junction in the direction of the drain zone 11. The voltage loading of the field plate dielectric 32 increases in this case in the direction of the drain zone 11. The thickness of the field plate dielectric 32 should in this case be chosen to be thick enough to avoid a voltage breakdown.

Due to the rectifier element 41 of the charging circuit, the field electrode 31 retains the previously stored electrical charge when the MOS transistor is driven in the off state. During subsequent driving cycles, therefore, the driver circuit 200 only has to subsequently supply an amount of charge equal to that possibly lost as a result of leakage losses. With the component in the off state, if the electrical potential of the drift zone 12 rises, the electrical potential of the field electrode 32 also rises due to the capacitive coupling. The dielectric strength of the diode 41 should in this case be chosen such that no voltage breakdown occurs when the potential of the field electrode 31 rises.

If, with the component in the off state, the electrical potential of the drift zone 12 rises relative to the electrical potential of the source zone 14, then the electrical potential in the field electrode 31 also rises due to the capacitive coupling between the drift zone and the field electrode 31. In order to reduce this rise in potential, a storage capacitance 42 may be provided, the storage capacitance being connected between the field electrode 31 and the source zone. When the potential of the field electrode 31 rises, the storage capacitance buffer-stores part of the charge previously stored in the field electrode.

The circuit components 41, 42 of the charging circuit 40 can be realized as integrated components, that is to say as components integrated in the semiconductor body 100. There is furthermore the possibility of realizing the circuit components 41, 42 in any desired manner as external components, that is to say components arranged outside the semiconductor body 100.

Figure 3A:
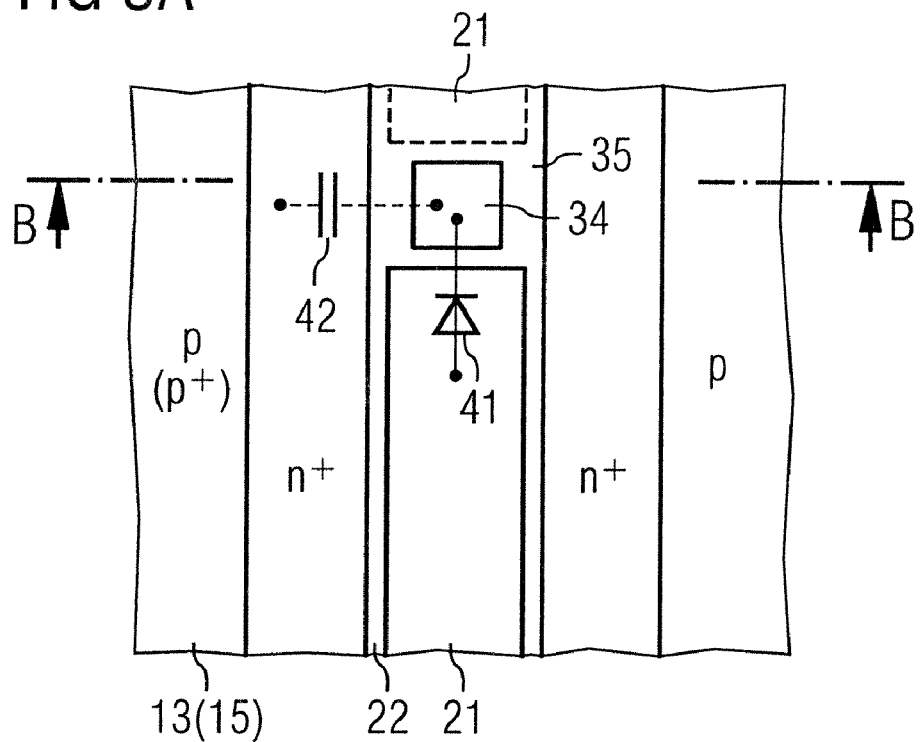
FIGS. 3A-3B illustrate one possibility for making electrical contact with the field electrode on the basis of different cross sections through a semiconductor body containing the MOS transistor.
Figure 3B:
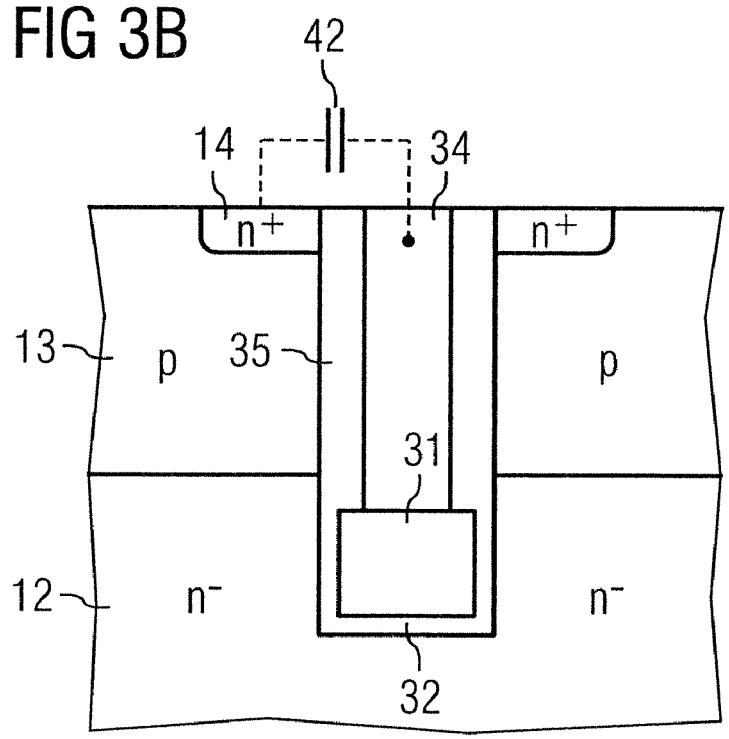

Referring to FIG. 3A, the trench with the gate electrode 21 and the field electrode 31 is formed in elongated fashion, for example, in a direction perpendicular to the plane of the drawing illustrated in FIG. 1. FIG. 3A illustrates a cross section through the MOS transistor in accordance with FIG. 1 in a sectional plane A-A illustrated in FIG. 1. For making contact with the field electrode 31 arranged in buried fashion, referring to FIGS. 3A and 3B, a connection electrode 34 may be provided, which extends within the trench proceeding from the front side 101 as far as the field electrode 31 and which is electrically insulated from the semiconductor body 100 by an insulation layer 35 within the trench. FIG. 3A illustrates such a connection electrode 34 in plan view, and FIG. 3B illustrates the connection electrode 34 in cross section in a sectional plane B-B illustrated in FIG. 3A. The connection electrode 34 is arranged adjacent to the gate electrode 21 in the longitudinal direction of the trench and is electrically insulated from the gate electrode. In this case, the connection electrode 34 can be arranged adjacent to one end of the gate electrode 21. In this case, the gate electrode can extend as far as an edge region of the semiconductor body in which no active component regions are arranged, and the connection electrode 34 can be arranged in the edge region of the semiconductor body in this case.

There is furthermore the possibility of realizing the gate electrode 21 with a plurality of elongated electrode sections, as is illustrated by dashed lines in FIG. 3A, and of providing a connection electrode 34 for making contact with the field electrode 31 in each case between two of such gate electrode sections. The connection electrode 34 has a connection pad or contact area in the region of the front side 101 of the semiconductor body, to which the rectifier element 41 and the capacitive storage element 42 of the charging circuit can be connected.

Figure 4:
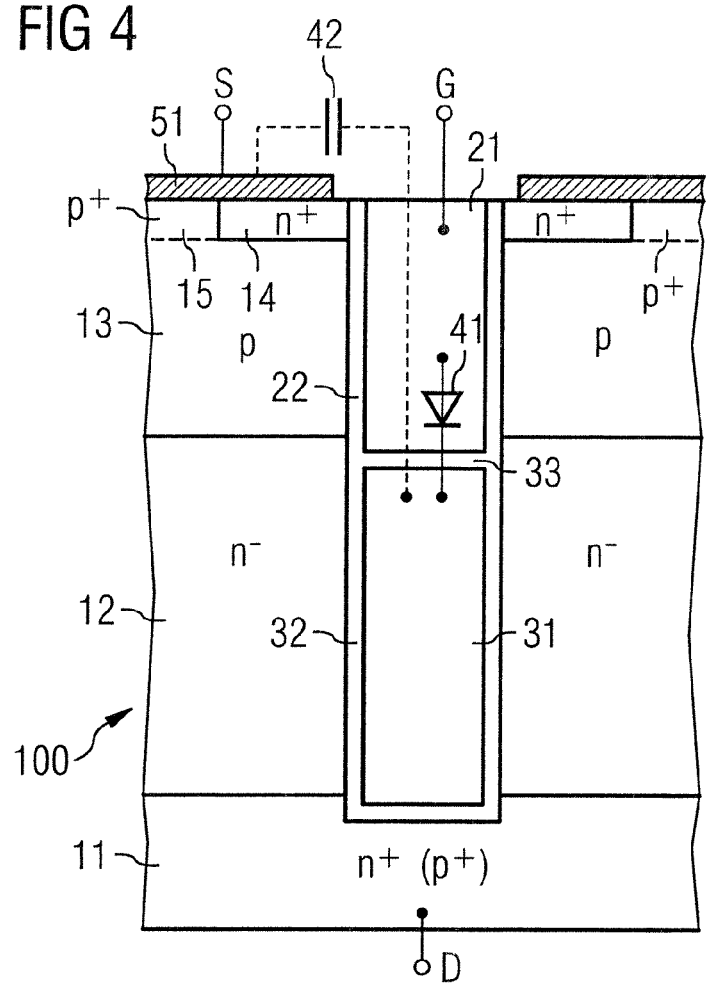
FIG. 4 illustrates one embodiment of a component arrangement in which the field electrode of the MOS transistor extends as far as a drain zone of the MOS transistor.

FIG. 4 illustrates a modification of the component arrangement illustrated in FIG. 1. In the case of the component arrangement illustrated in FIG. 4, the field electrode 31 extends in the vertical direction of the semiconductor body 100 as far as or right into the drain zone 11. An accumulation channel when the MOS transistor is driven in the on state can propagate over the entire length of the drift zone 12 in this case. A maximum voltage loading of the field plate dielectric 32 when the component is driven in the off state in this case corresponds to the load path voltage, or drain-source voltage, of the MOS transistor, in steady-state operation minus a storage voltage of the field electrode 31. The storage voltage arises as a result of the charging of the field electrode 31 when the MOS transistor is driven in the on state and as a result of the above-explained potential swing that occurs during turn-off, and corresponds to the potential difference between the electrical potential of the field electrode 31 and the source potential, that is to say at least approximately to the gate-source voltage. The maximum voltage loading of the field plate dielectric is therefore lower than in the case of components in which the field electrode is permanently at source potential or in which the field electrode is discharged in accordance with the gate electrode when the component is driven in the off state.

Figure 5:
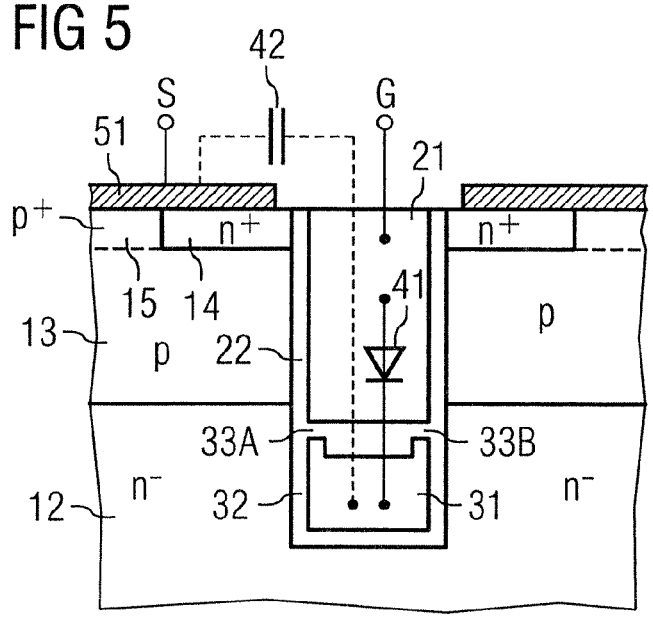
FIG. 5 illustrates one embodiment of a component arrangement in which there is high dielectric insulation between the gate electrode and the field electrode.

FIG. 5 illustrates one embodiment of a component arrangement. In the case of this component arrangement, a capacitive coupling between the gate electrode 21 and the field electrode 31 within the trench is reduced by virtue of the fact that a dielectric 33 that dielectrically insulates the gate electrode 21 from the field electrode 31 within the trench is made thicker in sections. This "isolating" dielectric 33 has thinner sections 33A in regions in which the field electrode 31 is directly adjacent to the field plate dielectric 32, and for the rest has a thicker section 33B. The thinner sections 33A have the effect that the field electrode 31, near the drift zone 12, is adjacent to the gate electrode 21 as close as possible in order to form an accumulation channel in the drift zone 12 below the body zone as far as possible along the entire trench. If the gate electrode 21 extends right into the drift zone 12 in the vertical direction, the gate electrode provides for the formation of such an accumulation channel in that region of the drift zone 12 which is adjacent to the body zone 13. In the further course of the trench, the field electrode 31 brings about such formation of an accumulation channel. The thickening of the dielectric layer 33B serves to reduce an undesirable capacitance between the field electrode 31 and the gate electrode 21. The capacitance is undesirable because it delays the switch-off operation as a result of the reactive effect of the rising potential at the field electrode 31 on the gate.

Figure 6:
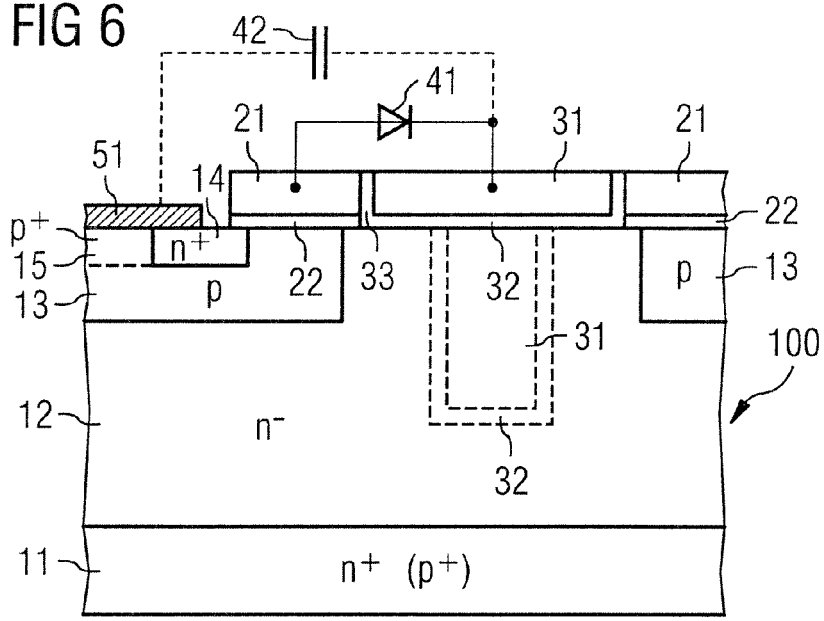
FIG. 6 illustrates one embodiment of the component arrangement in which the MOS transistor is embodied as a planar transistor.

FIG. 6 illustrates one embodiment of a component arrangement in which the MOS transistor is embodied as a planar transistor. In this case, the drift zone 12 extends in sections as far as the front side 101 of the semiconductor body and is separated from the source zone 14 by the body zone 13. The gate electrode 21 is arranged above the front side 101 of the semiconductor body adjacent to the body zone 13 that is insulated from the body zone 13 by the gate dielectric 22. Upon driving in the on state, in the case of this planar transistor, an inversion channel forms in the body zone 13 in a lateral direction of the semiconductor body 100 along the gate dielectric 22 in the region of the front side 101. In the case of this component arrangement, the field electrode 31 can be adjacent to the gate electrode 21 in a lateral direction of the semiconductor body 100 and brings about, following the inversion channel in the body zone 13, an accumulation channel in that section of the drift zone 12 which extends as far as the front side 101. In one embodiment, in the case of this planar transistor, the field electrode 31 can be arranged in a trench extending into the semiconductor body 100 in the vertical direction in the region in which the drift zone 12 extends as far as the front side 101.

Figure 7:
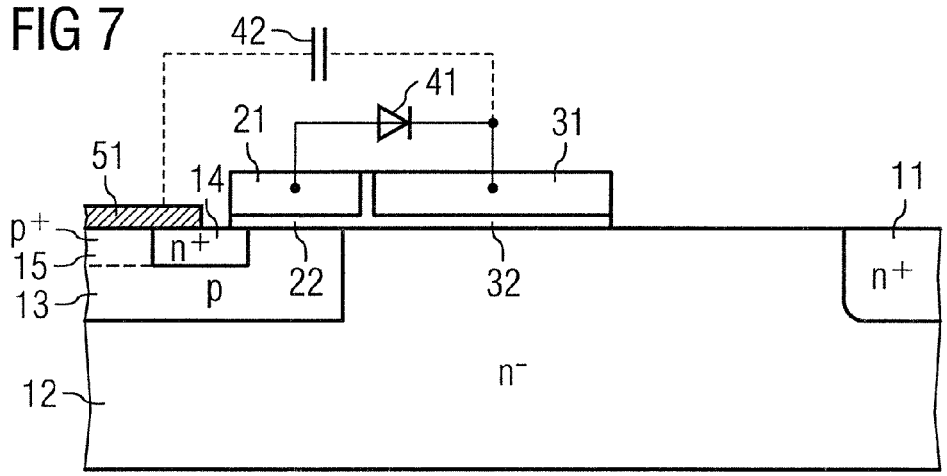
FIG. 7 illustrates one embodiment of a component arrangement in which the MOS transistor is realized as a lateral transistor.

FIG. 7 illustrates one embodiment of the component arrangement in which the MOS transistor is realized as a lateral transistor. In this case, the drain zone 11 of this MOS transistor is arranged at a distance from the body zone 13 and the source zone 14 in a lateral direction of the semiconductor body 100. In the case of this component, a current flow direction runs in a lateral direction of the semiconductor body 100. The transistor illustrated in FIG. 7 is realized as a planar transistor, the gate electrode 21 of which is arranged above the front side 101. In the case of the component illustrated, the field electrode 31 is likewise arranged above the front side 101 and is insulated from the semiconductor body 100 by the field plate dielectric 32.

Figure 8:
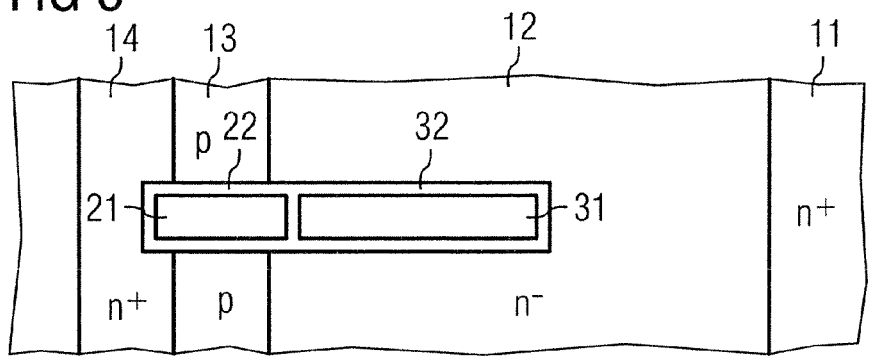
FIG. 8 illustrates one embodiment of a component arrangement in which the MOS transistor is realized as a lateral transistor.

FIG. 8 illustrates, on the basis of a plan view of the front side 101 of a semiconductor body 100, a further exemplary embodiment of a MOS transistor that can be used in the component arrangement. This MOS transistor is realized as a lateral transistor in which the drain zone 11 is arranged at a distance from the body zone 13 and the source zone 14 in a lateral direction of the semiconductor body 100. The gate electrode 21 and field electrode 31 are arranged in a trench which extends from the source zone 14 through the body zone 13 right into the drift zone 12 and in which the gate electrode 21 and the field electrode 31 are arranged adjacent to one another in a lateral direction.

Figure 9:
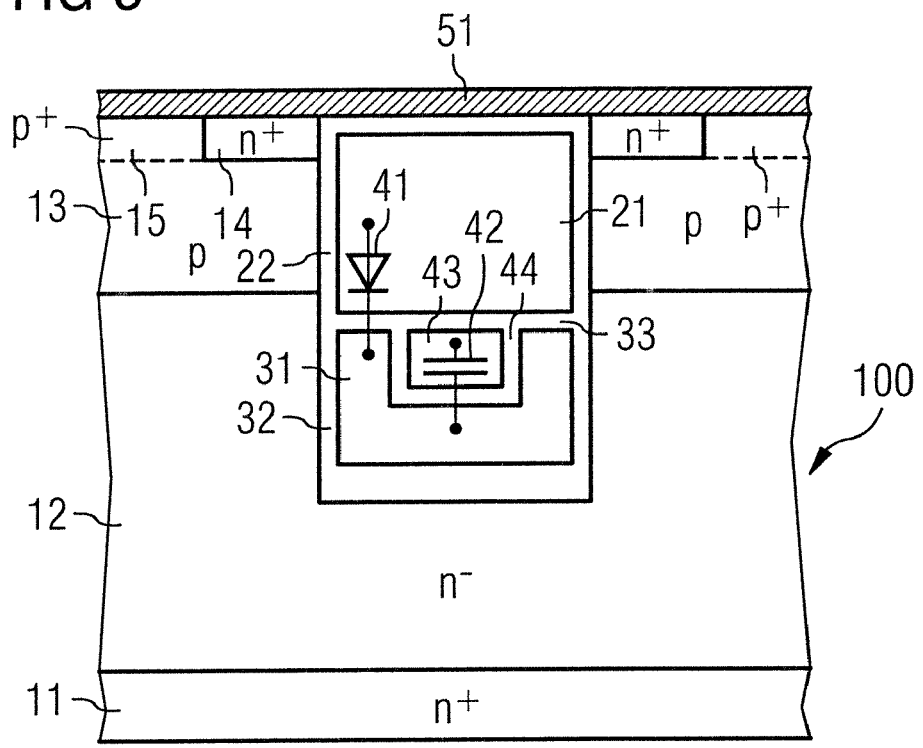
FIG. 9 illustrates one embodiment of the component arrangement having a capacitive storage element integrated into the semiconductor body, on the basis of a first cross section through the semiconductor body.

FIG. 9 illustrates one embodiment of a component arrangement in which a storage capacitance 42 of the charging circuit 40 is integrated in the semiconductor body 100 of the MOS transistor. In the example illustrated, the MOS transistor is a vertical trench transistor, the gate electrode 21 of which is arranged in a trench extending into the semiconductor body 100 in the vertical direction proceeding from a front side 101. In the case of this MOS transistor, the field electrode 31 is arranged in the same trench as the gate electrode 21 and below the gate electrode 21 in the vertical direction proceeding from the front side 101. In the case of this component arrangement, the storage capacitance 42 has a first and a second electrode, and also a storage dielectric 44 arranged between the electrodes. The first electrode of the storage capacitance 42 is formed by the field electrode 31 in this case. The second electrode 43 is arranged within the trench and is dielectrically insulated from the field electrode 31 by the storage dielectric 44. The second electrode 43, which is at source potential, and the field electrode 31 are insulated from the gate electrode 21 by a further dielectric layer 33 within the trench. In the example illustrated, the field electrode 31 is formed in U-shaped fashion and surrounds the second electrode 43 of the storage capacitance 42 on three sides in the example illustrated.

Figure 10:
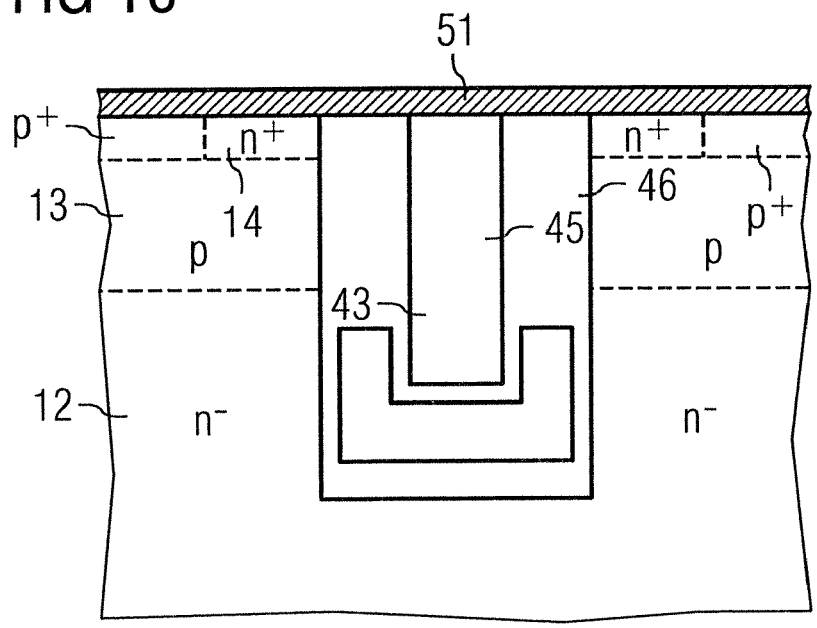
FIG. 10 illustrates a component arrangement in accordance with FIG. 9 on the basis of a further cross section through the semiconductor body.

In the case of the component arrangement illustrated, the field electrode 31 and the second electrode 43 of the storage capacitance are arranged in buried fashion below the gate electrode 21. For making contact with the field electrode 31, a connection electrode can be provided in accordance with FIGS. 3A and 3B, the connection electrode extending from the field electrode 31 as far as the front side 101 of the semiconductor body 100. A further connection electrode 45 can correspondingly be provided for making contact with the second electrode 43, the further connection electrode extending as far as the front side 101 of the semiconductor body. FIG. 10 illustrates a cross section through the semiconductor body 100 in the region of such a further connection electrode 45. In this case—in accordance with the explanations concerning FIGS. 3A and 3B—the connection electrodes for the field electrode 31 and the second electrode 43 of the storage capacitance are arranged in those regions in which the gate electrode 21 is interrupted.

Figure 11A:
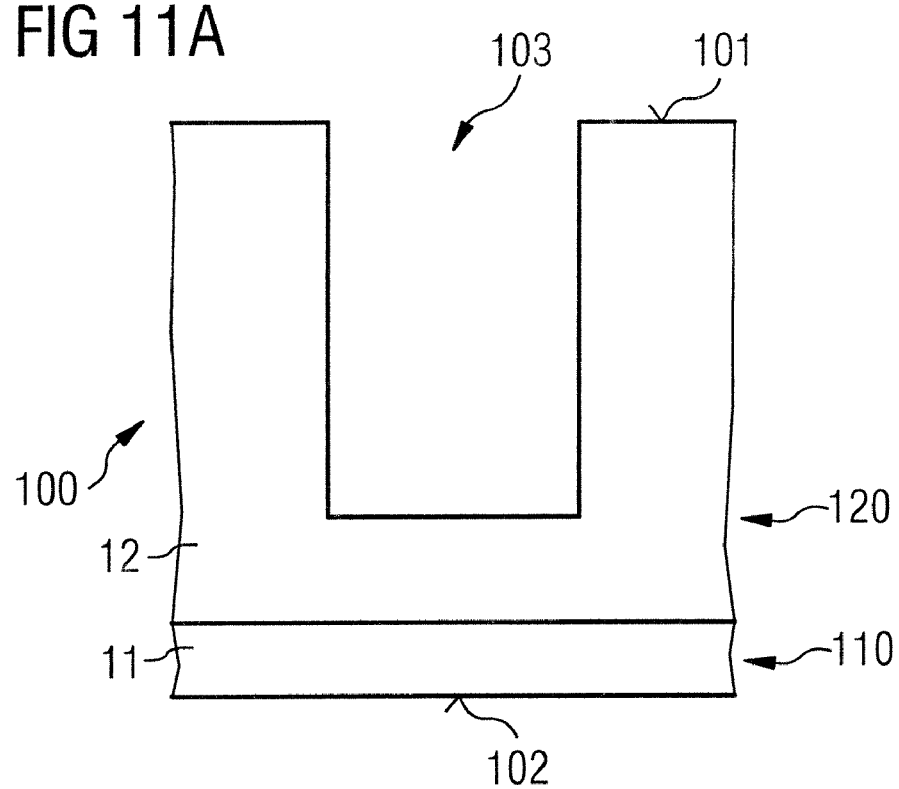
FIGS. 11A-11H and FIG. 11J illustrate a method for producing a component structure arranged in a trench of a semiconductor body, with a gate electrode, a field electrode and a capacitive storage element.

A method for realizing a component structure in which a gate electrode, a field electrode and a storage capacitance are arranged within a trench of a semiconductor body is explained below with reference to FIGS. 11A to 11H and FIG. 11J. FIG. 11A illustrates a cross section through a semiconductor body 100 after first method processes have been carried out, involving the production of a trench 103 extending into the semiconductor body in the vertical direction proceeding from the front side 101. The trench 103 is produced for example, by an etching method using a patterned mask applied to the front side 101, for example a mask composed of photoresist. The semiconductor body 100 includes for example two semiconductor layers 110, 120, of which the first semiconductor layer 110 forms the later drain zone 11 and the second semiconductor layer 120 forms the later drift zone 12 in sections. The first semiconductor layer 110 is a semiconductor substrate, for example, while the second semiconductor layer 120 may be an epitaxial layer applied epitaxially to the semiconductor substrate 110. It should be pointed out in this connection that the dimensions of these semiconductor layers which can be inferred from the figures are not true to scale.

Figure 11B:
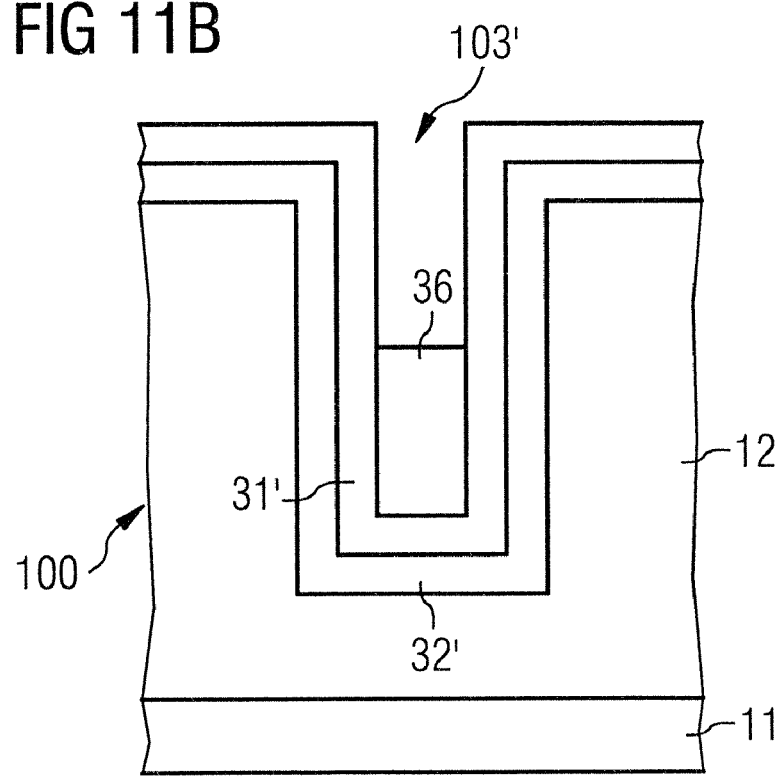

FIG. 11B illustrates the semiconductor body 100 after further method processes have been carried out, involving the application of a first dielectric layer 32' to sidewalls and to a bottom of the trench and a first electrode layer 31' to the first dielectric layer 32'. The first dielectric layer 32' is an oxide layer, for example, which is applied uniformly to the bottom and to the sidewalls of the trench by thermal oxidation or by a deposition process. In this case, this layer can also be applied above the front side 101 of the semiconductor body. The first electrode layer 31' is for example a layer of doped polysilicon deposited uniformly onto the first electrode layer 32'. In this case, the thickness of the dielectric layer 32' and the thickness of the electrode layer 31' are coordinated with a width of the trench 103 in such a way that the trench 103 is not completely filled, rather that a narrower trench 103' remains after deposition of these gate layers. The trench is partly filled with an auxiliary layer 36, which is composed for example of a resist or of a deposited (not thermally produced) oxide. The partial filling of the trench 103' with the auxiliary layer can be effected for example by completely filling the trench with an auxiliary material and subsequently etching back the auxiliary material anisotropically to a desired trench depth.

Figure 11C:
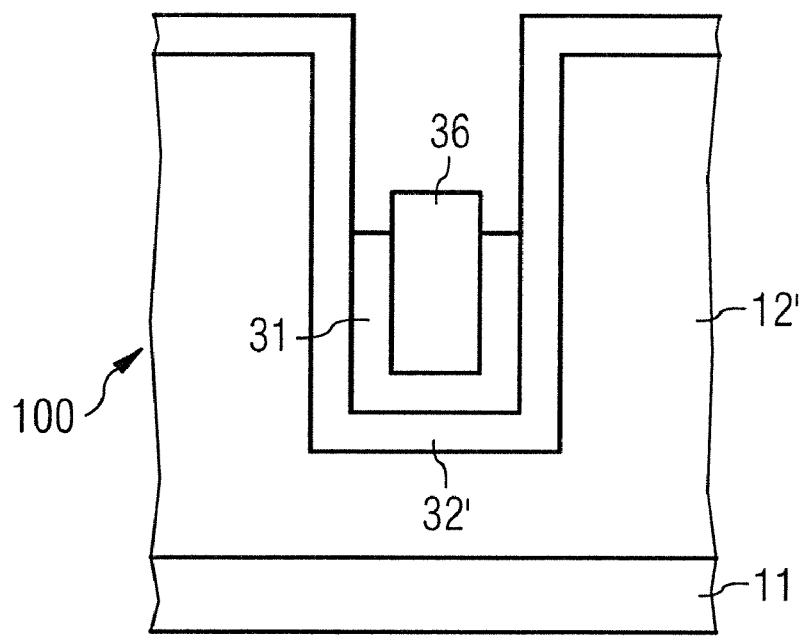

FIG. 11C illustrates the semiconductor body 100 in cross section after further method processes have been carried out, involving the removal of the electrode layer 31 partially, to be precise above the auxiliary layer 36, from the sidewalls of the trench and above the front side 101 of the semiconductor body 100. The result of this method process is an electrode 31 which forms the later field electrode and which is arranged in the trench between the dielectric layer 32' and the auxiliary layer 36. The partial removal of the electrode layer 31' can be effected for example by an isotropic etching method. During this etching method, the auxiliary layer 36 protects the regions of the earlier electrode layer 31' which are arranged below and laterally adjacent to the auxiliary layer 36, in which case the electrode layer 31' can be etched back in the upper region of the auxiliary layer 36 to be below an upper edge of the auxiliary layer 36, as is illustrated in FIG. 11C. The auxiliary layer 36 can be composed for example of a resist that is resistant to the etchant of the isotropic etching method.

Figure 11D:
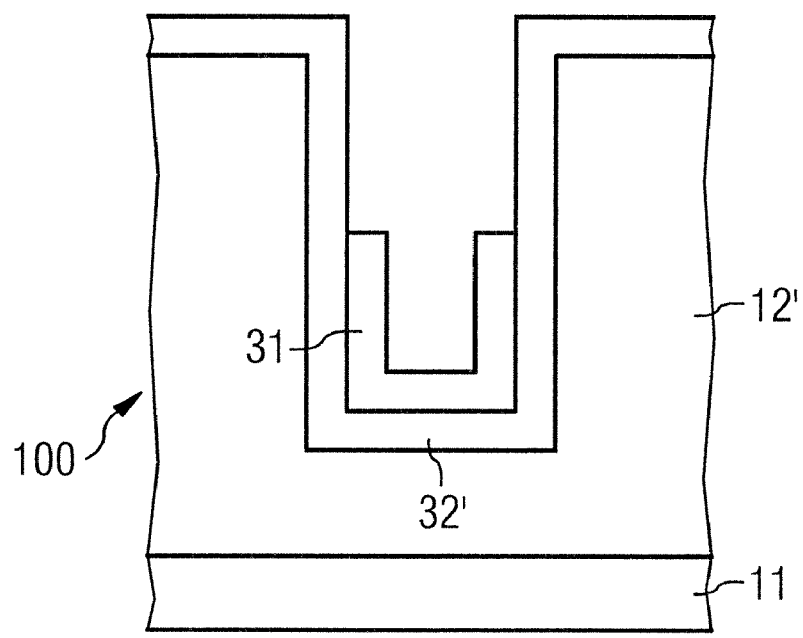

The auxiliary layer 36 is subsequently removed, which is illustrated as the result in FIG. 11D.

Figure 11E:
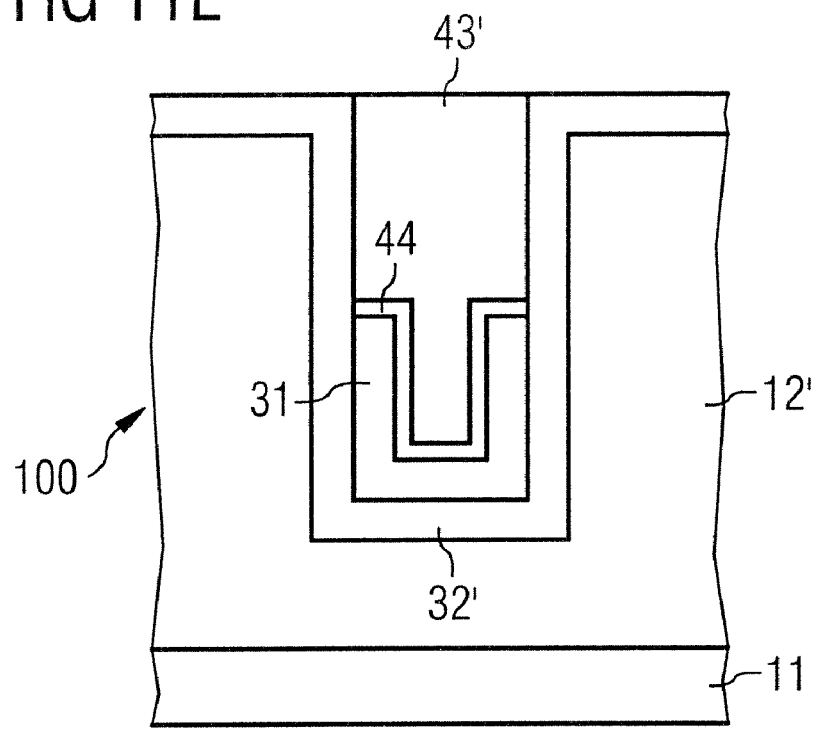

FIG. 11E illustrates the semiconductor body 100 after the production of a dielectric layer 44, which forms the later storage dielectric, on the field electrode 31. The dielectric layer 44 is an oxide layer, for example, which can be produced by thermal oxidation of uncovered surface regions of the field electrode 31.

Figure 11F:
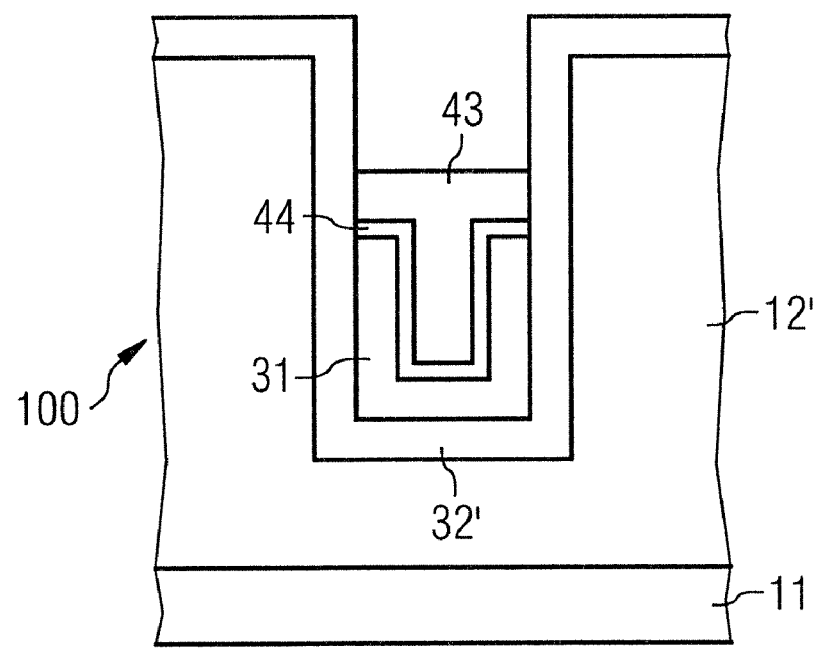

FIG. 11F illustrates the semiconductor body 100 after the production of the second electrode 43 of the storage capacitance on the storage dielectric layer 44. The second electrode 43 can be produced for example by filling the trench with an electrode material 43', as illustrated in FIG. 11E, and subsequently etching back the electrode material anisotropically to the desired height. In the case of the exemplary embodiment illustrated in FIG. 11F, the electrode layer 43' is etched back only to an extent such that the storage dielectric 44 remains completely covered by the electrode material. The second electrode 43 of the storage capacitance thereby has a T-shaped cross section with electrode sections which are arranged above the limbs of the U-shaped field electrode 31.

Figure 11G:
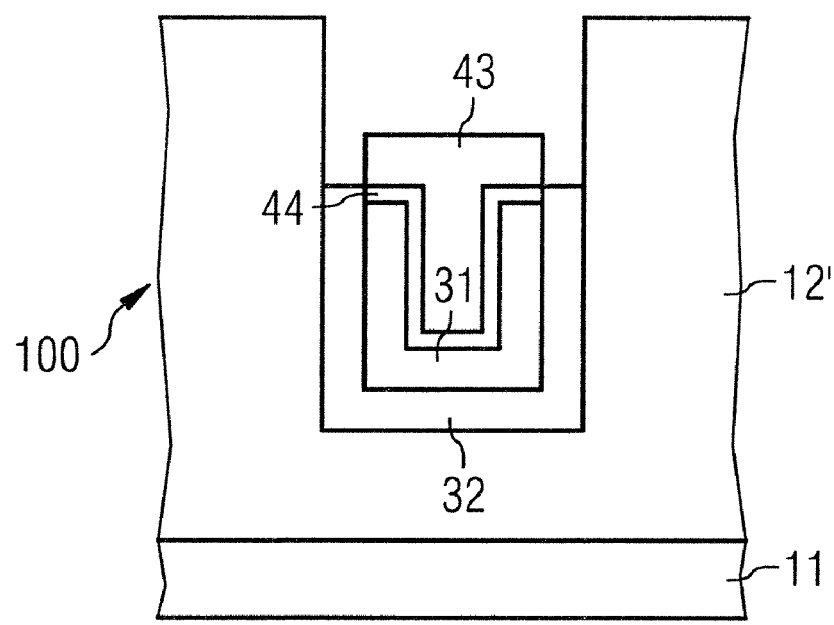

FIG. 11G illustrates the semiconductor body 100 after further method processes involving the removal of the first dielectric layer 32' from the front side 101 and above the field electrode 31 from the side walls of the trench. In the direction of the field electrode 31, however, the dielectric layer is removed only to an extent such that the field electrode 31 remains completely insulated from the semiconductor body 100 by a remaining section 32 of the dielectric layer 32'. The remaining section 32 of the dielectric layer 32' forms the later field electrode dielectric. The partial removal of the dielectric layer 32' is effected by an isotropic etching method, for example, by which the electrode layer 32' can be etched back in the vertical direction to below an upper edge of the second storage electrode 43.

Figure 11H:
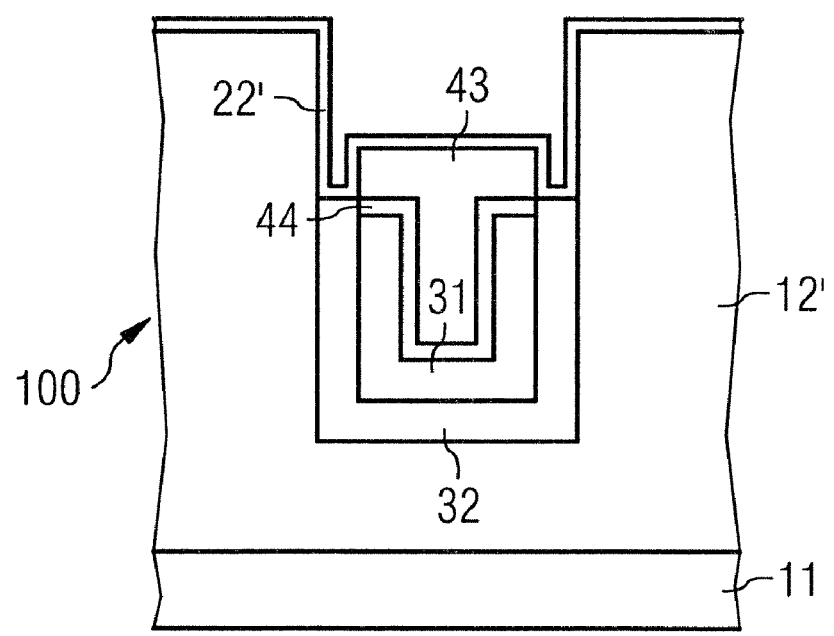

FIG. 11H illustrates the semiconductor body 100 after further method processes involving the production of a dielectric layer 22' on uncovered surfaces of the semiconductor body 100 and the second storage electrode 43. The further dielectric layer 32' forms the later gate dielectric within the trench.

Figure 11J:
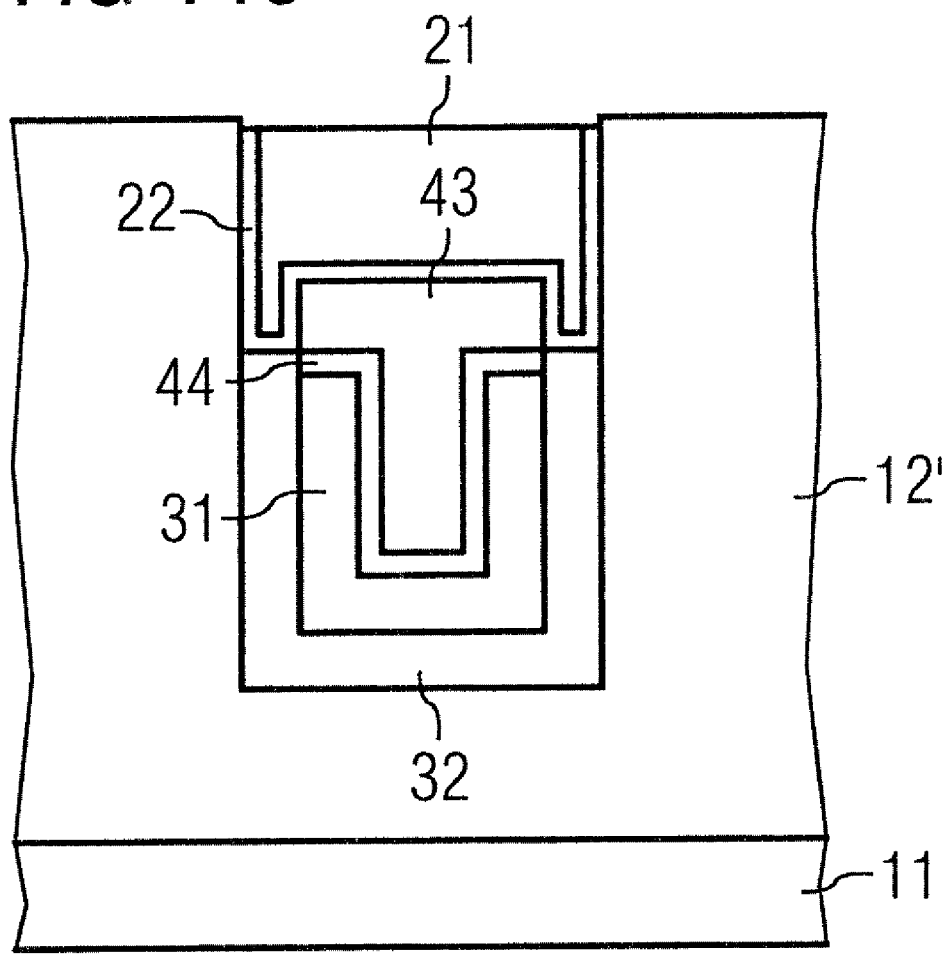

FIG. 11J illustrates the semiconductor body 100 after the production of the gate electrode 21. For this purpose, by way of example, the trench is filled with a further electrode material. The dielectric layer 22' can subsequently be removed from the front side 101 of the semiconductor body 100, for example by an anisotropic etching method. The result of the method processes explained is a component structure having, within a trench of a semiconductor body, a gate electrode 21, a field electrode 31 and also a storage capacitance formed by the field electrode 31, a further electrode 43 and also a storage dielectric 44.

These method processes explained can be followed by known further implantation or diffusion methods for producing the body zone and the source zone and method processes for producing the connection electrodes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A component arrangement comprising:
   a MOS transistor having a gate electrode;
   a drift zone;
   a field electrode, arranged adjacent to the drift zone and dielectrically insulated from the drift zone by a dielectric layer;
   a charging circuit, having a rectifier element connected between the gate electrode and the field electrode,
   wherein the MOS transistor is integrated in a semiconductor body, and the gate electrode and the field electrode are arranged in a common trench in the semiconductor body;

wherein the MOS transistor has a source zone, and the charging circuit has a capacitive storage element connected between the field electrode and the source zone; and wherein the capacitive storage element is arranged in the trench.

2. The component arrangement of claim 1, wherein the capacitive storage element has a first and a second electrode and a storage dielectric arranged between the first and second electrode.

3. The component arrangement of claim 2, wherein the first electrode of the capacitive storage element is formed by the field electrode.

4. The component arrangement of claim 3, wherein the second electrode of the capacitive storage element is arranged within the trench between the gate electrode and the field electrode.

5. The component arrangement of claim 1, wherein the MOS transistor is a MOSFET.

6. The component arrangement of claim 1, comprising wherein the MOS transistor is realized as an IGBT.

7. The component arrangement of claim 1, in which the MOS transistor is realized as a vertical transistor, in which a current flow direction in the drift zone runs in a vertical direction of the semiconductor body.

8. The component arrangement of claim 1, comprising wherein the MOS transistor is a lateral transistor, a current flow direction in the drift zone runs in a lateral direction of the semiconductor body.

9. The component arrangement of claim 1, wherein the rectifier element is polarized in such a way that the field electrode, when the component is driven in the on state, is charged with a charge suitable for forming an accumulation channel in the drift zone.

10. An integrated circuit comprising:
a semiconductor body;
a MOS transistor having a gate electrode;
a drift zone;
a field electrode, arranged adjacent to the drift zone and dielectrically insulated from the drift zone by a dielectric layer;
a charging circuit, having a rectifier element connected between the gate electrode and the field electrode;
one or more additional electrical components;
wherein the MOS transistor is integrated in the semiconductor body, and the gate electrode and the field electrode are arranged in a common trench in the semiconductor body;
wherein the MOS transistor has a source zone, and the charging circuit has a capacitive storage element connected between the field electrode and the source zone; and
wherein the capacitive storage element is arranged in the trench.

11. The integrated circuit of claim 10, wherein the capacitive storage element has a first and a second electrode and a storage dielectric arranged between the first and second electrode.

12. The integrated circuit of claim 11, wherein the first electrode of the capacitive storage element is formed by the field electrode.

* * * * *

UNITED STATES PATENT AND TRADEMARK OFFICE
CERTIFICATE OF CORRECTION

PATENT NO. : 8,405,146 B2
APPLICATION NO. : 12/773580
DATED : March 26, 2013
INVENTOR(S) : Armin Willmeroth et al.

Page 1 of 1

It is certified that error appears in the above-identified patent and that said Letters Patent is hereby corrected as shown below:

On the Title Page, Item (62) Related U.S. Application Data: delete "Jan. 9, 2008" and insert in place thereof --Jan. 29, 2008--.

Signed and Sealed this
Twenty-sixth Day of November, 2013

Margaret A. Focarino
*Commissioner for Patents of the United States Patent and Trademark Office*